United States Patent
Weng et al.

(10) Patent No.: US 9,594,146 B2
(45) Date of Patent: Mar. 14, 2017

(54) TRAJECTORY CORRECTION METHOD AND APPARATUS FOR K-SPACE DATA IN MAGNETIC RESONANCE IMAGING

(71) Applicants: De He Weng, Shenzhen (CN); Qiong Zhang, Shenzhen (CN)

(72) Inventors: De He Weng, Shenzhen (CN); Qiong Zhang, Shenzhen (CN)

(73) Assignee: Siemens Aktiengesellschaft, Munich (DE)

( * ) Notice: Subject to any disclaimer, the term of this patent is extended or adjusted under 35 U.S.C. 154(b) by 921 days.

(21) Appl. No.: 13/927,376

(22) Filed: Jun. 26, 2013

(65) Prior Publication Data

US 2014/0005969 A1  Jan. 2, 2014

(30) Foreign Application Priority Data

Jun. 29, 2012 (CN) .......................... 2012 1 0220184

(51) Int. Cl.
*G01R 35/00* (2006.01)
*G01R 33/565* (2006.01)
*G01R 33/48* (2006.01)

(52) U.S. Cl.
CPC ....... *G01R 35/005* (2013.01); *G01R 33/4822* (2013.01); *G01R 33/565* (2013.01); *G01R 33/482* (2013.01); *G01R 33/4824* (2013.01)

(58) Field of Classification Search
CPC ............ G01R 33/565; G01R 33/56518; G01R 33/56554; G01R 33/56572; G01R 33/482; G01R 33/4822; G01R 33/4826; G01R 33/56

See application file for complete search history.

(56) References Cited

U.S. PATENT DOCUMENTS

| 6,144,874 A * | 11/2000 | Du | G01R 33/5676 |
| | | | 324/307 |
| 2010/0164495 A1* | 7/2010 | Takizawa | G01R 33/482 |
| | | | 324/309 |

OTHER PUBLICATIONS

Peters et al., "Centering the Projection Reconstruction Trajectory: Reducing Gradient Delay Errors," Magnetic Resonance in Medicine 50 pp. 1-6 (2003).*
Of Lechner et al., "Spiral Imaging Artifact Reduction: A Comparison of Two k-Trajectory Measurement Methods", Journal of Magnetic Resonance Imaging 29, pp. 1485-1492 (2009).*

* cited by examiner

*Primary Examiner* — Mohamed Charioui
*Assistant Examiner* — Catherine Rastovski
(74) *Attorney, Agent, or Firm* — Schiff Hardin LLP

(57) ABSTRACT

In a trajectory correction method and apparatus for k-space data points in magnetic resonance imaging, a magnetic resonance data acquisition unit is operated to execute a sampling sequence to obtain k-space to be corrected. Empirical points are selected used to divide k-space to be corrected into a central region and a peripheral region. The trajectories of the data points in the central region and the peripheral region are corrected and the sampling sequence is executed again, with the corrected trajectories, to obtain corrected k-space.

5 Claims, 2 Drawing Sheets

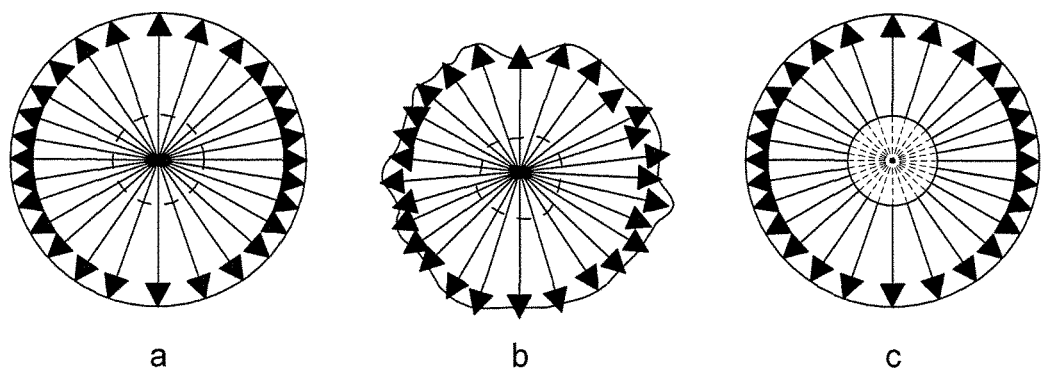
a    b    c
FIG. 1
FIG. 2
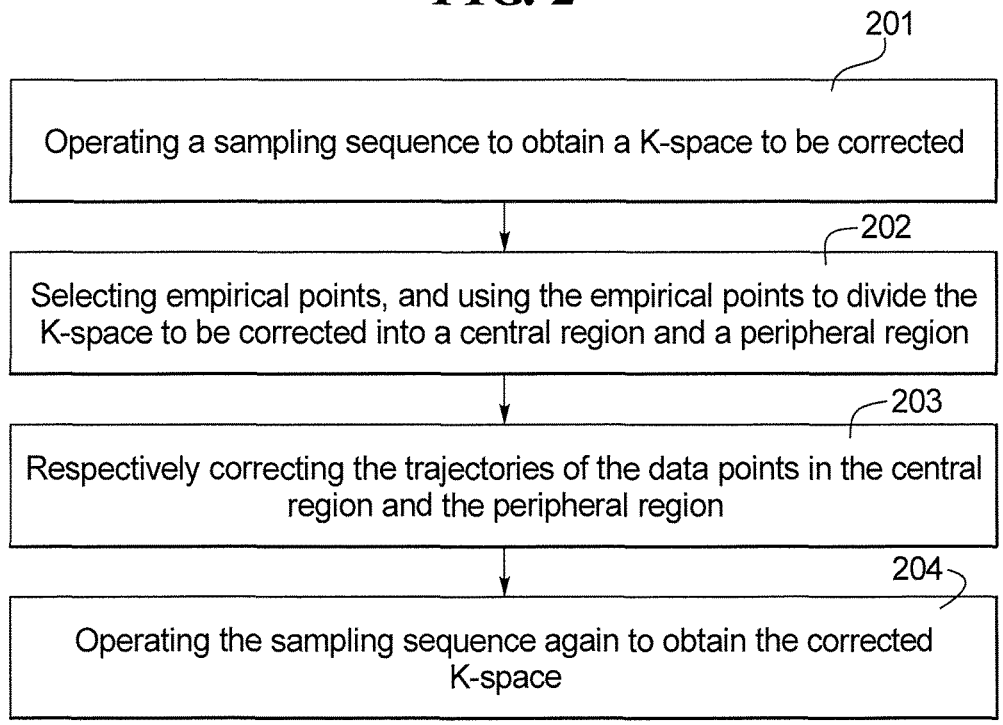

TRAJECTORY CORRECTION METHOD AND APPARATUS FOR K-SPACE DATA IN MAGNETIC RESONANCE IMAGING

BACKGROUND OF THE INVENTION

Field of the Invention

The present invention concerns magnetic resonance imaging, and in particular a trajectory correction method and apparatus for k-space data in magnetic resonance imaging.

Description of the Prior Art

The term spatial frequency refers to variations in frequency per unit of distance in a certain direction of a periodically changing physical parameter. The spatial frequency k is a space vector, and is usually used for describing certain energies that spread in space in the form of waves (such as various electromagnetic waves). Due to the vector properties of k, usually three vector components $k_x$, $k_y$, and $k_z$, which are mutually perpendicular to each other, are used to represent k. These three vector components $k_x$, $k_y$, and $k_z$ correspond to a three-dimensional coordinate system, and the mathematical space or domain corresponding to the coordinate system determined by $k_x$, $k_y$, and $k_z$ is called k-space.

In the field of magnetic resonance imaging, k-space is filled by magnetic resonance (MR) signal raw data with spatial orientation encoding information. Each MR image has k-space data corresponding thereto. Performing Fourier transform on the data in k-space decodes the spatial orientation encoding information in the raw data to obtain MR image data, i.e. mapping MR data with different signal intensities to corresponding spatial positions (i.e. allocating the signal intensity values to respective pixels of the MR image) can reconstruct an MR image. The data in k-space are very relevant to the MR image quality. Data in the central region of k-space determine the property (i.e. contrast ratio) of the MR image, while the edge (periphery) data of k-space determine the spatial resolution of the MR image.

Data acquisition sequences for acquiring MR data to enter into k-space include Cartesian sequences, non-Cartesian sequences, fast imaging sequences, etc. Compared to Cartesian sequences, non-Cartesian sequences and fast imaging sequences are very sensitive to gradient delay and eddy currents, that will result in a positional shift of the data points in k-space. If the shift between the actually obtained position of a data point and the desired filling trajectory of the data point is not corrected, then erroneous filling of k-space data will result, thus introducing image artifacts, and reducing the quality of the reconstructed MR image.

In the prior art, trajectory correction of data points in k-space is readily performed by calculating the desired trajectories of the data points of the entirety of k-space, which requires a significant amount of complicated calculations. Moreover, since the calculated region is the entirety of k-space, accumulated errors resulting from large region correction calculation are also very large, which affects the image quality.

SUMMARY OF THE INVENTION

An object of the invention is to provide a trajectory correction method for k-space data points in magnetic resonance imaging, that locally corrects the positions of the data points in k-space, so as to substantially reduce the calculation amount for trajectory correction and the complexity of the calculation.

The trajectory correction method for k-space data points in magnetic resonance imaging according to the invention is a data acquisition sequence to fill k-space wherein a readout gradient is respectively applied to each of the x axis, y axis and z axis, and the positions of the data points in k-space are measured, and the actual filling positions of the data points in k-space on the x axis, y axis and z axis are respectively calculated. Empirical points are selected and the selected empirical points are used to divide k-space into a central region and a peripheral region. The gradient delay time of the respective empirical points on the x axis, y axis and z axis are calculated according to the actual filling positions of the empirical points on the x axis, y axis and the z axis. The calculated gradient delay time for the empirical points on the x axis, y axis and z axis is respectively applied to the x axis, y axis and z axis, and the trajectories of the data points in k-space are re-measured so as to obtain corrected filling positions of the data points in k-space, after being corrected by the gradient delay time on the x axis, y axis and z axis. The corrected filling positions of the data points in the peripheral region on the x axis, y axis and z axis are used as the final filling positions of the data points in the peripheral region on the x axis, y axis and z axis. Using the corrected filling positions of the data points in the central region of k-space on the x axis, y axis and z axis, the final filling positions of the data points in k-space are calculated in the central region. The data acquisition sequence is then again executed in order to obtain k-space that is corrected according to the gradient delay time.

The present invention also encompasses a trajectory correction apparatus for k-space data points in magnetic resonance imaging.

The apparatus includes an MR data acquisition unit that executes a data acquisition sequence to obtain data entered in k-space, to be corrected.

Readout gradients are respectively applied on the x axis, y axis and z axis. A first measurement unit measures the positions of the data points in k-space to be corrected, and calculating the actual filling positions of the data points in k-space to be corrected on the x axis, y axis and z axis.

A division unit selects empirical points and uses the empirical points to divide k-space to be corrected into a central region and a peripheral region.

A first calculation unit respectively calculates the gradient delay time of the empirical points on the x axis, y axis and z axis according to the actual filling positions of the empirical points on the x axis, y axis and z axis.

A second measurement unit respectively applies the gradient delay time obtained through calculation of the empirical points on the x axis, y axis and z axis to the x axis, y axis and z axis, and re-measures the positions of the data points in k-space to be corrected so as to obtain corrected filling positions of the data points in k-space after being corrected by the gradient delay time on the x axis, y axis and z axis. The second measurement unit uses the corrected filling positions of the data points in peripheral region on the x axis, y axis and z axis as the final filling positions of the data points in the peripheral region on the x axis, y axis and z axis.

A second calculation unit uses the corrected filling positions of the data points in the central region on the x axis, y axis and z axis to calculate the final filling positions of the data points in k-space to be corrected in the central region.

The data acquisition unit then again executes the data acquisition sequence to obtain k-space corrected according to the gradient delay time.

The positional correction method for the data points in k-space provided by the present invention thus divides k-space into a nonlinear region (i.e. the central region) and a linear region (i.e. the peripheral region), and applies different techniques to respectively perform positional correction on the data points in these two regions, thereby greatly reducing the calculation amount for the trajectory correction and the complexity of the calculation. Moreover, since a calculation is only performed on the final filling positions of the data points in the nonlinear region, the region of nonlinear calculation is reduced in size, which reduces the accumulated errors resulting from a large-region correction calculation. This further increases the stability of the correction algorithm, and improves the imaged image quality at the same time.

BRIEF DESCRIPTION OF THE DRAWINGS

FIG. 1a is a schematic diagram of an ideal k-space provided by an embodiment of the present invention.

FIG. 1b is a schematic diagram of an actually obtained k-space with disordered trajectories provided by an embodiment of the present invention.

FIG. 1c s a schematic diagram of k-space obtained after performing trajectory correction of k-space with disordered positions shown in FIG. 1b according to an embodiment of the present invention.

FIG. 2 is a flow chart of an embodiment of a trajectory correction method for k-space data in magnetic resonance imaging according to the present invention.

DESCRIPTION OF THE PREFERRED EMBODIMENTS

Shown in FIG. 1a is a schematic diagram of ideal k-space obtained by acquiring MR data to fill k-space according to a non-Cartesian sequence, e.g. a radial sequence. However, in actual operations, due to being affected by the electromagnetic effect resulting from eddy current, gradient changes will be prevented in each readout gradient (RO) direction, and therefore the filling (data entry) positions of the data points located in the central region (i.e. the region with a gradually increasing gradient magnitude) in k-space will be disordered; while in the peripheral region (i.e. the region of which the gradient magnitude is a constant) of k-space, even though the filling positions of the data points located in this region are not disordered. Due to being affected by the accumulated errors within the central region, the filling positions of the data points in the peripheral region will also shift, and therefore, the actually obtained k-space is shown as in FIG. 1b. The purpose of the trajectory correction method for k-space data in magnetic resonance imaging provided by the embodiments of the present invention is to correct the trajectories of the data points in k-space shown in FIG. 1b so as to enable corrected k-space shown in FIG. 1c to be the closest to k-space shown in FIG. 1a.

Shown in FIG. 2 is a flow chart of a trajectory correction method for k-space data in magnetic resonance imaging provided by one embodiment of the present invention. The method includes the following steps.

Step 201, a sampling sequence is operated to obtain k-space to be corrected.

In the present embodiment, a radial sampling sequence is used, and k-space as actually obtained thereby is shown as in FIG. 1b.

Step 202, empirical points are selected, and these empirical points are used to divide k-space to be corrected into a central region and a peripheral region.

Figure 3:
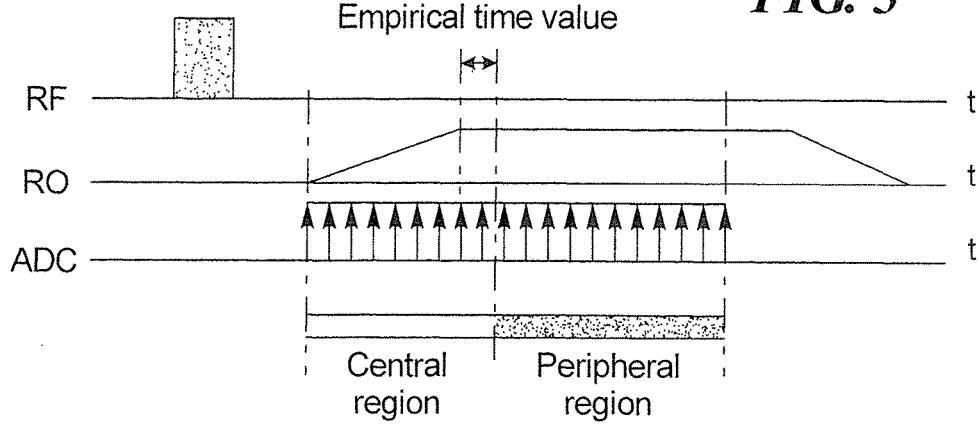
FIG. 3 is a flow chart of an embodiment for selecting empirical points in a trajectory correction method for k-space data in magnetic resonance imaging according to the present invention.

When applying a readout gradient to k-space, an oblique acquisition period and a constant shift period of the readout gradient can be identified. During the oblique acquisition period, the magnitude of the readout gradient (also the size of the readout gradient) gradually increases; while during the constant shift period, the magnitude of the readout gradient is relatively constant. Hence, in step 203, a sampling point after delaying an empirical time value N after the oblique acquisition period of the readout gradient is ended can be selected as said empirical point regarding one readout gradient direction, e.g. in the embodiments of the present invention, selecting a data point after delaying 30 microseconds after the oblique acquisition period of the readout gradient is ended as an empirical point, and in other readout gradient directions, the data points after delaying 30 microseconds after the oblique acquisition period of the readout gradient is ended are all applied as empirical points. Thus, the boundary formed by the empirical points in all the readout gradient directions can divide the k-space to be corrected into a central region and a peripheral region, and the empirical points are the points separating the central region and the peripheral region of k-space, as shown in FIG. 3. The central region is a nonlinear region, while the peripheral region is a linear region. Since the gradient delay time in each readout gradient direction is different, when selecting an empirical time value N, it should be ensured that not only the data points in the divided peripheral region are all in the constant shift period, but also the range of the divided central region is as small as possible, so as to reduce the calculation amount of correction calculation, e.g. in the embodiments of the present invention, the empirical time value is selected as 30 microseconds. The value of the empirical time value can also be adjusted according to the image quality after imaging. For example, if the imaging effect is not ideal when the empirical time value is 30 microseconds, at this moment, the empirical time value can be adjusted larger or smaller according to specific situations, such as adjusted to be 20 microseconds or 40 microseconds, and it is not specifically defined herein. As shown in FIG. 3, ADC represents readout data; RO is a readout gradient; and RF is a radio frequency pulse with respect to time t.

Step 203, the trajectories of the data points in said central region and said the peripheral region are respectively corrected.

In step 203, when the readout gradient is respectively applied to an x axis, a y axis and a z axis, the trajectories of the data points in k-space to be corrected are measured, and the actual filling positions of the data points in k-space to be corrected on x axis, y axis and z axis are respectively calculated.

The actual filling positions of the data points on the x axis, the y axis and the z axis in k-space are also trajectories projected respectively onto the three physical coordinate axes of the data point.

Measuring the trajectory of a data point projected onto the x axis in k-space to be corrected when the readout gradient is applied to the x axis will be used as an example. At this point in time, a radio frequency pulse is used for respectively exciting two layers which are perpendicular to the x axis and symmetric along a magnetic isocenter, then data are respectively acquired to acquire the actual filling position $K'_x$ of each data point on the x axis in k-space, wherein the symmetric excitation method can eliminate the additional phase introduced by BO eddy current effects. The aforementioned process is repeated respectively on the y axis and the z axis, then the actual filling positions $K'_y$ and $K'_z$ of any data point in k-space on the y axis and the z axis are obtained.

Using one data point in one readout gradient direction as an example, calculating the actual filling position thereof on the x axis is described below.

1. Before calculating the actual filling position of the data point on the x axis, firstly the phase $\Delta\Phi_1$ of that data point on an excitation layer A where it is located is acquired, and the phase $\Delta\Phi_2$ of a symmetric point of that data point on another excitation layer B that is symmetric along a magnetic isocenter is acquired.

2. The actual filling position $K'_x$ of the data point on the x axis is calculated according to the following formula (1):

$$K'(t) = \frac{(\Delta\Phi_1 - \Delta\Phi_2) * FOV}{D_r * 2\pi} \quad (1)$$

where $K'(t)$ is the actual filling position of the data point on the x axis, FOV (field of view) is the imaging range, and $D_r$ is the distance between the excitation layer where the data point is located and the magnetic isocenter.

The calculation processes of the actual filling positions of the data point on the y axis and the z axis are the same as the abovementioned process, and thus need not be described individually herein.

The gradient delay time of the empirical point on the x axis, y axis and z axis can be respectively calculated according to the actual filling positions of the empirical point on the x axis, y axis and z axis. The following two substeps can be specifically included: firstly, respectively calculating the shifts of the empirical point on the x axis, y axis and z axis according to the actual filling positions of that empirical point on the x axis, y axis and z axis; and then, respectively calculating the gradient delay time of said empirical point on the x axis, y axis and z axis according to the shifts obtained through calculation.

Specifically, when applying a readout gradient on the x axis, the y axis and the z axis, the desired filling positions $L_{x\text{-}desired}$, $L_{y\text{-}desired}$ and $L_{z\text{-}desired}$ of all the data points on the x axis, the y axis and the z axis in the readout gradient direction can be respectively calculated according to the following formula (2);

$$L_{desired} = \frac{\gamma}{2\pi} \int G dt \quad (2)$$

where $L_{desired}$ is the desired filling position of the empirical point on the x axis, y axis or z axis, $\gamma$ is the gyromagnetic ratio, and G is the gradient magnitude respectively applied to the x axis, y axis or z axis;

then, in accordance with the following formula (3), shifts of the empirical point on the x axis, the y axis and the z axis are calculated according to the abovementioned desired filling positions and the actual filling positions $K'_x$, $K'_y$, and $K'_z$ of the empirical point on the x axis, the y axis and the z axis obtained through calculation in the above step 202:

$$K_{shift} = K' - L_{desired} \quad (3)$$

where $K_{shift}$ is the shift of the empirical point on the x axis, y axis or z axis; $K'$ is the actual filling position of the empirical point on the x axis, y axis or z axis, and $L_{desired}$ is the desired filling position of the empirical point on the x axis, y axis or z axis;

then, in accordance with the following formula (4), the gradient delay time of the empirical point on the x axis, the y axis and the z axis is respectively calculated according to the calculated shifts, taking calculating the gradient delay time on the x axis as an example:

$$K_{shift} = G \cdot \Delta T_{delay} \quad (4)$$

where $K_{shift}$ is the shift of the empirical point on the x axis; G is the gradient magnitude applied to the empirical point (the size of the gradient magnitude is equal to that of the magnitude of the readout gradient applied to the operated sampling sequence, or is proportional thereto), and $\Delta T_{delay}$ is the gradient delay time of the empirical point on the x axis.

The above-described process is respectively repeated on the y axis and the z axis so as to obtain the gradient delay time of the empirical point on the y axis and the z axis.

After obtaining the gradient delay time of the empirical points on the x axis, the y axis and the z axis, the gradient delay time of the empirical points on the x axis, y axis and z axis is respectively applied to the x axis, y axis and z axis. The trajectories of the data points of k-space to be corrected are then measured again so as to respectively obtain the corrected filling positions of the data points in the k-space corrected by the gradient delay time on the x axis, y axis and z axis. The corrected filling positions of the data points in the peripheral region on the x axis, y axis and z axis are used as the final filling positions in the peripheral region of the data points on the x axis, y axis and z axis.

Since the peripheral region is a linear region, the gradient delay time of each data point on the x axis, the y axis and the z axis in the peripheral regions is the same, it is only required to correct the filling positions of all the data points in the peripheral region according to the gradient delay time of the selected empirical points on the x axis, the y axis and the z axis. In other words, in the peripheral region, when applying the gradient delay time of the empirical point on the three coordinate axes obtained in step 204 respectively to the x axis, the y axis and the z axis, the filling positions of all the data points on the three coordinate axes in the peripheral region are corrected so as to be the ideal filling positions in k-space shown in FIG. 1a. Thus, in the embodiments of the present invention, the trajectories of the data points of the peripheral region are automatically corrected without needing to perform complicated correction calculation.

Regarding one data point in the central region, after remeasuring the trajectories of all the data points in k-space according to the gradient delay time of said empirical point on the x axis, the y axis and the z axis, the corrected filling positions of the data point on the x axis, the y axis and the z axis are respectively $K_x$, $K_y$, and $K_z$. At this moment, $K_x$, $K_y$, and $K_z$ are filling positions corrected by the gradient delay time of the empirical point on the x axis, the y axis and the z axis.

Then, in accordance with the corrected filling positions of the data points in the central region on the x axis, y axis and z axis, the final filling positions of the data points in k-space to be corrected in the central region are obtained through calculation. In step 206, in accordance with the following formula (5), the final filling positions of the data points in the k-space in any readout gradient direction in the central region can be obtained through the combined calculation of $K_x$, $K_y$, and $K_z$.

$$K_{real}=K_x \sin\theta \cos\phi \cdot \vec{x}+K_y \sin\theta \sin\phi \cdot \vec{y}+K_z \cos\theta \cdot \vec{z} \quad (5)$$

where $K_{real}(t)$ is the final filling position of the data point in the central region, $K_x$, $K_y$, $K_z$ are respectively the corrected filling positions of the data point on the x axis, the y axis and the z axis in the central region obtained in step 204, θ is the angle between the remeasured trajectory of the data point and the z axis, and φ is the angle between the remeasured trajectory of the data point and the x axis.

Step 204, the sampling sequence is operated again to obtain k-space corrected according to the gradient delay time.

In this step, the sampling sequence is executed again to read data points. At this point in time, regarding the data points in the peripheral region, the projection positions thereof on the x axis, y axis and z axis are respectively automatically adjusted to be the final filling positions of the data points in the peripheral region on the x axis, y axis and z axis obtained in the step 205. This is also to correct the trajectories of the data points in the peripheral region so as to be the trajectories in ideal k-space as shown in FIG. 1a. Regarding the data points in the central region, the data points are entered into the final filling positions of the data points in the central region obtained through calculation in step 206. K-space obtained in step 207 is shown in FIG. 1c. By then, the correction to the trajectories of the data points in k-space to be corrected is completed.

In FIG. 1c, taking the center point of k-space as the center of a circle, the region within the first circle from inside to outside is the central region, while the region between the first circle and the second circle is the peripheral region. It can be seen from FIG. 1c that the trajectories of the data points in the peripheral region have been corrected to be completely the same as the ideal k-space in FIG. 1a, while the corrected trajectories of the data points in the central region are very close to the trajectories of the ideal k-space as shown in FIG. 1a.

By then, the description of the trajectory correction method for k-space data points in magnetic resonance imaging provided by the embodiments of the present invention is completed. It can be seen that in the abovementioned method embodiments, with regard to the peripheral region, correcting the trajectories of the data points in the peripheral region requires only applying the gradient delay time obtained through calculation without involving any complicated correction calculation; and with regard to the central region, the final filling positions of the data points within the region are obtained through correction calculation, thus correcting the trajectories of the data points in the region. Therefore, it is only required to perform correction calculation on the central region, i.e. the region of nonlinear calculation (i.e. correction calculation) is narrowed.

Figure 4:
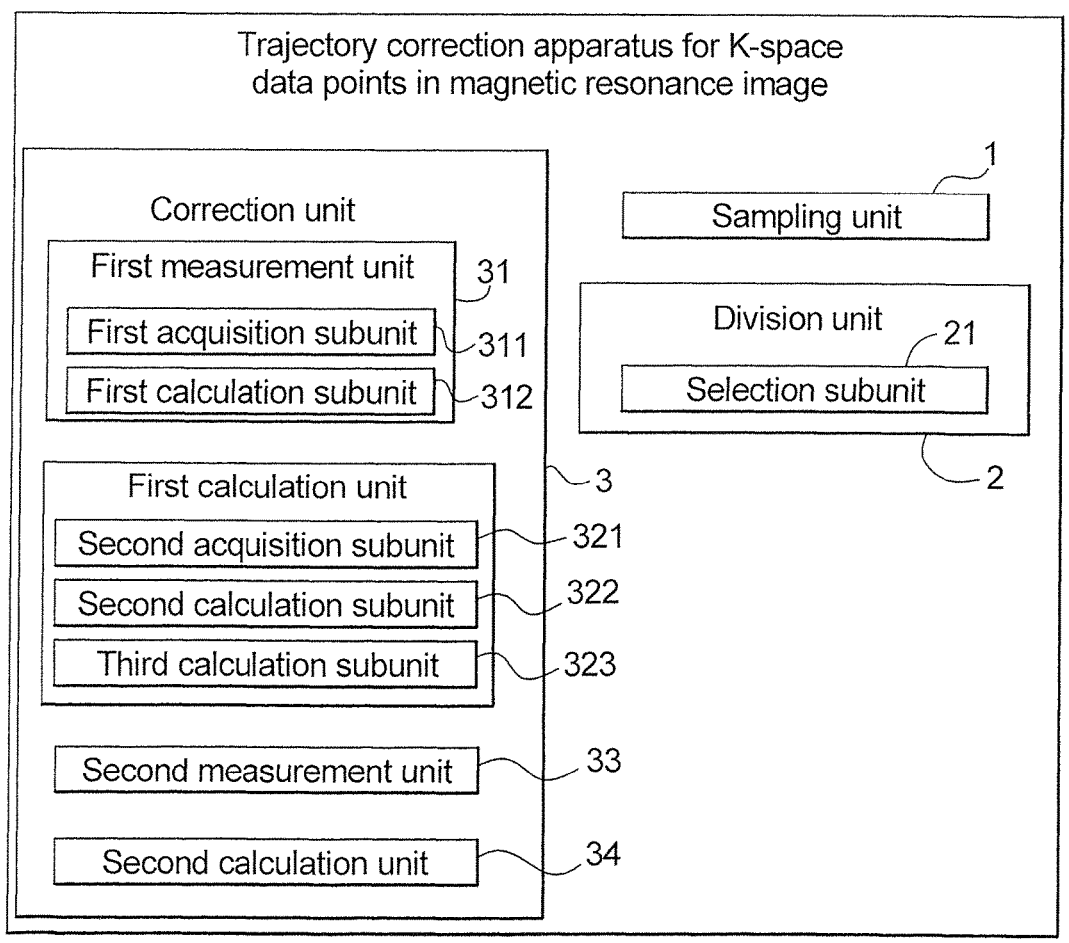
FIG. 4 is a schematic diagram of the architecture of a trajectory correction apparatus for k-space data in magnetic resonance imaging according to an embodiment of the present invention.

The present invention also encompasses a trajectory correction apparatus for k-space data points in magnetic resonance imaging, as shown in FIG. 4. The apparatus includes a sampling unit (magnetic resonance data acquisition unit, i.e., a scanner operated by a control unit) 1 that executes a sampling sequence to obtain k-space to be corrected, a computerized division unit 2 that selects empirical points, and uses the empirical points to divide k-space to be corrected into a central region and a peripheral region, and a computerized correction unit 3, that respectively corrects the trajectories of the data points in the central region and the peripheral region, wherein the sampling unit 1 is configured to execute the sampling sequence again to obtain k-space corrected with the corrected trajectories according to the gradient delay time.

The division unit 2 includes a selection subunit 21 that selects sampling points after delaying an empirical time value after an oblique acquisition period of the readout gradient is ended, as the empirical points.

The correction unit 3 includes a first measurement unit 31, that, when the readout gradient is respectively applied to the x axis, the y axis and the z axis, measures the trajectories of the data points in k-space to be corrected, and respectively calculating the actual filling positions on the x axis, y axis and z axis of the data points in k-space to be corrected. The correction unit 3 also has a first calculation unit 32, that respectively calculates the gradient delay time of the empirical points on the x axis, y axis and z axis according to the actual filling positions of said empirical points on the x axis, y axis and z axis.

The correction unit 3 also has a second measurement unit 33 that respectively applies the gradient delay time obtained through calculation of the empirical points on the x axis, y axis and z axis to the x axis, y axis and z axis, and that remeasures the trajectories of the data points in k-space to be corrected so as to respectively obtain the corrected filling positions of the data points in k-space on the x axis, y axis and z axis after being corrected by the gradient delay time. The second measurement unit 33 furthermore takes the corrected filling positions of the data points in the peripheral region on the x axis, y axis and z axis as the final filling positions of the data points in the peripheral region on the x axis, y axis and z axis.

The correction unit 3 also has a second calculation unit 34 that, in accordance with the corrected filling positions of the data points in the central region on the x axis, y axis and z axis, calculates the final filling positions of the data points in k-space to be corrected in the central region.

The first measurement unit 31 includes a first acquisition subunit 311 that acquires the phase $\Delta\Phi_1$ of the data point on an excitation layer where it is located, and acquires the phase $\Delta\Phi_2$ of a symmetric point of the data point on another excitation, layer which is symmetric along a magnetic isocenter, and a first calculation subunit 312 that respectively calculates the actual filling positions of the data points in k-space to be corrected on the x axis, y axis and z axis.

The first calculation unit 32 includes a second acquisition subunit 321 that, in accordance with the readout gradient applied to the x axis, y axis and z axis, acquires the desired filling positions of the data points on the x axis, y axis and z axis in a direction of the readout gradient.

The first calculation unit 32 also has a second calculation subunit 322 that respectively calculates the shifts of said empirical points on the x axis, y axis and z axis, and a third calculation subunit 323 that respectively calculates the gradient delay time of said empirical points on the x axis, y axis and z axis.

The apparatus embodiments correspond to the above-described method embodiments.

In summary, the trajectory correction method of data points in k-space provided by the embodiments of the present invention divides k-space into a nonlinear region (i.e. central region) and a linear region (i.e. peripheral region), and applies different methods to respectively perform trajectory correction regarding the data points in these two regions, thereby greatly reducing the calculation amount of trajectory correction and the complexity of calculation.

Moreover, because the calculation is performed only on the final filling positions of the data points in the nonlinear region, the size of the region of nonlinear calculation is reduced, which reduces the accumulated errors resulting from large-region correction calculation, thereby further increasing the stability of the correction algorithm, and improving the imaged image quality at the same time.

The present invention provides a trajectory correction method for k-space data points in magnetic resonance imaging, that includes executing a sampling sequence to obtain k-space to be corrected, selecting empirical points, and using the empirical points to divide k-space to be corrected into a central region and a peripheral region, respectively correcting the trajectories of the data points in the central region and the peripheral region, and executing the sampling sequence again to obtain corrected k-space. Applying the present invention can locally correct the trajectories of the data points in k-space, reducing the calculation amount and calculation complexity of trajectory correction.

Although modifications and changes may be suggested by those skilled in the art, it is the intention of the inventor to embody within the patent warranted hereon all changes and modifications as reasonably and properly come within the scope of his contribution to the art.

We claim as our invention:

1. A method for acquiring magnetic resonance (MR) data comprising:
   from a processor, operating an MR data acquisition scanner to execute an MR data acquisition pulse sequence to read out raw MR data from a subject, and to enter the raw MR data into a memory as k-space data;
   from said processor, operating said MR data acquisition scanner in said data acquisition pulse sequence to read out said raw MR data by actuating, in each of three orthogonal directions of a Cartesian coordinate system, a readout gradient magnetic field that comprises a first gradient portion in which a magnitude of said gradient magnetic field changes with respect to time followed by a second portion in which said magnitude of said gradient magnetic field is constant, and entering said raw MR data into said memory as said k-space data with respect to axes in said memory respectively corresponding to said orthogonal directions, along respective actual trajectories that fill actual data entry locations in said memory with said MR raw data;
   in said processor, dividing said data entry locations in said memory into a central region of said axes, filled with said raw MR data read out during said first portion of each readout gradient magnetic field, and a peripheral region of said axes, filled with said raw MR data read out during said second portion of each readout gradient magnetic field;
   in said processor, automatically calculating, for each of said actual trajectories, a deviation of said data entry locations only in said peripheral region from respective filling locations along predetermined ideal trajectories for filling said memory and, from said deviation, automatically calculating a delay time for activating said readout gradient magnetic fields, relative to respective times at which said readout gradient magnetic fields were activated in said MR data acquisition pulse sequence, that will conform each actual trajectory in said peripheral region to each ideal trajectory;
   from said processor, operating said MR data acquisition scanner to acquire further raw MR data with said readout gradient magnetic fields respectively activated with the calculated delay times, and thereby obtaining acquired corrected k-space data only in said peripheral region of said memory and re-acquired MR raw data in said central region of said memory;
   in said processor, executing a correction calculation algorithm only for said re-acquired raw MR data in said central region of said memory, thereby obtaining calculated corrected k-space data; and
   making said acquired corrected k-space data and said calculated corrected k-space data available from said processor in electronic form as a datafile.

2. The method as claimed in claim 1, comprising:
   from said processor, operating said MR data acquisition scanner in said MR data acquisition pulse sequence to radiate radio-frequency pulses at respectively excite nuclear spins in said subject in an imaging range FOV that comprises first and second layers of said subject that are symmetrical with respect to an isocenter of the MR data acquisition scanner, with the MR raw data at each of said data entry locations having a magnitude and a phase; and
   in said processor, calculating the actual data entry locations in each of said trajectories by
      identifying the phase $\Delta\Phi_1$ of the MR raw data at the respective data entry location of the first layer, and identifying the phase $\Delta\Phi_2$ of the raw MR data at a data entry location of the second excitation layer that is symmetric to said respective data entry location of said first excitation layer with said isocenter, and
      calculating each actual data entry location k'(t) for all axes according to:

$$K'(t) = \frac{(\Delta\Phi_1 - \Delta\Phi_2) * FOV}{D_r * 2\pi}$$

wherein $D_r$ is a distance between the respective layer in which the data entry location is situated and the isocenter.

3. The method as claimed in claim 2, comprising calculating the delay time by:
   calculating, for each of said axes, the data entry locations L desired in each of said ideal trajectories according to:

$$L_{desired} = \frac{\gamma}{2\pi} \int G dt$$

wherein $\gamma$ is the gyromagnetic ratio of said nuclear spins, and G is the magnitude of the second portion of the gradient magnetic field activated along the respective axis;
   calculating the deviation $K_{shift}$ for each axis according to:

$$K_{shift} = K' - L_{desired}$$

wherein K' is the actual data entry location on the respective axis;
   calculating the gradient delay time $\Delta T_{delay}$ of said empirical points on the x axis, y axis and z axis according to:

$$K_{shift} = G \cdot \Delta T_{delay}.$$

4. The method as claimed in claim 1, comprising, in said correction algorithm for the MR data in said central region calculating a final data entry location $K_{real}(t)$ for said re-acquired raw MR data on all axes in said central region according to:

$$K_{real}=K_x \sin\theta\cos\phi\cdot\vec{x}+K_y \sin\theta\sin\phi\cdot\vec{y}+K_z \cos\theta\cdot\vec{z}$$

wherein $K_x$, $K_y$, $K_z$ are respectively corrected data entry locations of the re-acquired raw MR data on the x axis, y axis and z axis in said central region, $\theta$ is an angle between a re-acquired trajectory of the re-acquired raw MR data in said central region and the z axis, and $\phi$ is an angle between the re-acquired trajectory of the re-acquired raw MR data and the x axis.

5. A magnetic resonance (MR) apparatus comprising:

an MR data acquisition scanner;

a processor in communication with a memory;

said processor being configured to operate said MR data acquisition scanner to execute an MR data acquisition pulse sequence to read out raw MR data from a subject, and to enter the raw MR data into a memory as k-space data;

said processor being configured to operate said MR data acquisition scanner in said data acquisition pulse sequence to read out said raw MR data by actuating, in each of three orthogonal directions of a Cartesian coordinate system, a readout gradient magnetic field that comprises a first gradient portion in which a magnitude of said gradient magnetic field changes with respect to time followed by a second portion in which said magnitude of said gradient magnetic field is constant, and to enter said raw MR data into said memory as said k-space data with respect to axes in said memory respectively corresponding to said orthogonal directions, along respective actual trajectories that fill actual data entry locations in said memory with said MR raw data;

said processor being configured to divide said data entry locations in said memory into a central region of said axes, filled with said raw MR data read out during said first portion of each readout gradient magnetic field, and a peripheral region of said axes, filled with said raw MR data read out during said second portion of each readout gradient magnetic field;

said processor being configured to automatically calculate, for each of said actual trajectories, a deviation of said data entry locations only in said peripheral region from respective filling locations along predetermined ideal trajectories for filling said memory and, from said deviation, to automatically calculate a delay time for activating said readout gradient magnetic fields, relative to respective times at which said readout gradient magnetic fields were activated in said MR data acquisition pulse sequence, that will conform each actual trajectory in said peripheral region to each ideal trajectory;

said processor being configured to operate said MR data acquisition scanner to acquire further raw MR data with said readout gradient magnetic fields respectively activated with the calculated delay times, and thereby obtain acquired corrected k-space data only in said peripheral region of said memory and re-acquired MR raw data in said central region of said memory;

said processor being configured to execute a correction calculation algorithm only for said re-acquired raw MR data in said central region of said memory, to thereby obtain calculated corrected k-space data; and said processor being configured to make said acquired corrected k-space data and said calculated corrected k-space data available from said processor in electronic form as a datafile.

* * * * *